United States Patent
Rose et al.

(10) Patent No.: US 9,960,124 B2
(45) Date of Patent: May 1, 2018

(54) INTEGRATED SHIELD STRUCTURE FOR MIXED-SIGNAL INTEGRATED CIRCUITS

(71) Applicant: General Electric Company, Schenectady, NY (US)

(72) Inventors: James Wilson Rose, Guilderland, NY (US); Oliver Richard Astley, Clifton Park, NY (US); Donna Marie Sherman, East Greenbush, NY (US); Jonathan David Short, Saratoga Springs, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 32 days.

(21) Appl. No.: 14/061,531

(22) Filed: Oct. 23, 2013

(65) Prior Publication Data
US 2015/0108357 A1  Apr. 23, 2015

(51) Int. Cl.
*H01L 23/552* (2006.01)

(52) U.S. Cl.
CPC .... *H01L 23/552* (2013.01); *H01L 2924/0002* (2013.01)

(58) Field of Classification Search
CPC .................. H01L 2924/3025; H01L 23/552
USPC ..... 250/336.1, 372, 338.4, 370.09; 324/322; 378/62; 257/428, 659
See application file for complete search history.

(56) References Cited

U.S. PATENT DOCUMENTS

| | | | |
|---|---|---|---|
| 4,942,400 A * | 7/1990 | Tarzaiski et al. | ............. 341/155 |
| 5,151,769 A * | 9/1992 | Immorlica et al. | ............ 257/659 |
| 5,786,597 A * | 7/1998 | Lingren et al. | ......... 250/370.09 |
| 5,811,882 A * | 9/1998 | Latham et al. | ............... 257/776 |
| 6,838,713 B1 * | 1/2005 | Gheewala | ......... H01L 27/11807 |
| | | | 257/211 |
| 8,492,762 B2 | 7/2013 | Rose et al. | |
| 2002/0043674 A1 * | 4/2002 | Haga | ................ H01L 31/02019 |
| | | | 257/294 |
| 2006/0192265 A1 | 8/2006 | Hsu | |
| 2006/0192288 A1 | 8/2006 | Ueno et al. | |
| 2006/0252240 A1 * | 11/2006 | Gschwandtner et al. | .... 438/584 |
| 2007/0096029 A1 * | 5/2007 | Narasimhan | .......... G06T 1/0007 |
| | | | 250/369 |
| 2007/0297154 A1 * | 12/2007 | Caruba | ........................ 361/760 |
| 2008/0006773 A1 * | 1/2008 | Rose et al. | ................. 250/336.1 |
| 2008/0099887 A1 | 5/2008 | Song et al. | |
| 2009/0061567 A1 | 3/2009 | Kemerling et al. | |
| 2009/0068474 A1 * | 3/2009 | Lower | ..................... C09D 1/02 |
| | | | 428/433 |
| 2009/0184405 A1 * | 7/2009 | Lu | ........................ H01L 23/552 |
| | | | 257/660 |

(Continued)

OTHER PUBLICATIONS

Gabriella Trucco et al., "Analog Design Issues for Mixed-Signal CMOS Integrated Circuits", Advances in Analog Circuits, pp. 165-180, 2011.

*Primary Examiner* — David Porta
*Assistant Examiner* — Blake Riddick
(74) *Attorney, Agent, or Firm* — Pabitra K. Chakrabarti (57) ABSTRACT

In certain embodiments, a mixed signal integrated circuit is provided that includes both a digital portion and an analog portion. A shield is provided that overlays one of the digital portion or the analog portion of the mixed signal integrated circuit. The shield limits propagation of signals between the digital portion and the analog portion of the mixed signal integrated circuit.

17 Claims, 8 Drawing Sheets

(56) References Cited

U.S. PATENT DOCUMENTS

| | | | |
|---|---|---|---|
| 2009/0206455 A1* | 8/2009 | Harper et al. | 257/659 |
| 2009/0243052 A1* | 10/2009 | Chien | 257/659 |
| 2009/0262290 A1* | 10/2009 | Sampica | B32B 17/10018 349/122 |
| 2010/0127351 A1* | 5/2010 | Quinn | H01L 23/5223 257/534 |
| 2010/0244212 A1* | 9/2010 | Ha et al. | 257/676 |
| 2011/0057826 A1* | 3/2011 | Peng | H03M 1/002 341/155 |
| 2012/0183119 A1* | 7/2012 | Ikhlef | A61B 6/035 378/19 |
| 2012/0273926 A1 | 11/2012 | Pagaila | |

* cited by examiner

INTEGRATED SHIELD STRUCTURE FOR MIXED-SIGNAL INTEGRATED CIRCUITS

BACKGROUND

The subject matter disclosed herein relates to mixed signal circuitry, such as circuitry used to perform analog-to-digital conversion.

In modern medicine, medical professionals routinely conduct patient imaging examinations to assess the internal tissue of a patient in a non-invasive manner. Furthermore, for industrial applications related to security or quality control, screeners may desire to non-invasively assess the contents of a container (e.g., a package or a piece of luggage) or the internal structure of a manufactured part. Accordingly, for medical, security, and industrial applications, X-ray and other imaging techniques may be useful for noninvasively characterizing the internal composition of a volume of interest.

X-ray imaging techniques typically involves the generation of X-rays from a source, such as an X-ray tube. The X-rays pass through a volume undergoing imaging in which the patient or object being imaged is situated. As the X-rays pass through the volume, they may be differentially absorbed as they pass through the patient or object. The X-rays subsequently impact a radiation detector that, through various mechanisms, may generate electrical signals that correspond to the incidence of X-rays at different locations on the detector surface.

Typically the initial signal is analog in nature and analog-to-digital conversion circuitry may be employed to convert the analog signal to digital signals that are more suitable for subsequent image processing steps. The analog-to-digital conversion process may be implemented on an integrated circuit component which, by the nature of the operation, works on both analog and digital signals at varying locations. However, such a mixed signal implementation may be problematic in a circuit. For example, digital signals handled in the circuit may propagate into the analog input channels of the circuit, such as through the wiring leads or through the circuit itself, thereby negatively impacting the performance of the mixed signal circuit.

BRIEF DESCRIPTION

In one embodiment, a mixed signal integrated circuit is provided. The mixed signal integrated circuit comprises a substrate comprising a plurality of conductive traces and contact pads. The substrate comprises a digital portion comprising a first set of contact pads and conductive traces configured to route and process digital signals and an analog portion comprising a second set of contact pads and conductive traces configured to route and process analog signals. The mixed signal integrated circuit further comprises at least one shield positioned over the digital portion of the substrate so as to limit propagation of signals between the digital portion and the analog portion.

In a further embodiment, a semiconductor package assembly is provided. The semiconductor package assembly comprises a mixed signal integrated circuit. The mixed signal integrated circuit comprises a digital portion comprising a first set of contact pads and conductive traces configured to route and process digital signals and an analog portion comprising a second set of contact pads and conductive traces configured to route and process analog signals. The semiconductor package assembly further comprises a package structure configured to interface with the mixed signal integrated circuit to form the semiconductor package assembly. The package structure comprises at least a shield that overlays one of the digital portion or the analog portion of the mixed signal integrated circuit. The shield limits propagation of signals between the digital portion and the analog portion of the mixed signal integrated circuit.

In an additional embodiment, a non-invasive imaging system is provided. The non-invasive imaging system comprises a detector assembly configured to generate analog signals in response to detected signals. The non-invasive imaging system further comprises a conversion circuit configured to convert the analog signals to digital signals. The conversion circuit comprises an analog portion comprising a first set of contact pads and conductive traces configured to route and process the analog signals and a digital portion comprising a second set of contact pads and conductive traces configured to route and process digital signals. The non-invasive imaging system further comprises a shield that overlays one of the digital portion or the analog portion of the conversion circuit. The shield limits propagation of signals between the digital portion and the analog portion of the conversion circuit. The non-invasive imaging system also comprises a processing component configured to receive and process the digital signal to generate one or more images and to display the one or more images.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Mixed signal circuits, in which both analog and digital signals are processed or propagated (such as analog-to-digital conversion (ADC) or digital-to-analog conversion (DAC) circuitry) may suffer from decreased performance due to the propagation of one signal type to portions of the circuit dedicated to the other signal type. For example, in an ADC circuit, digital signals may propagate into the analog channels (e.g., analog input channels), thus degrading the analog inputs. For example, in the case of an application specific integrated circuit (ASIC) such propagation may be through the wiring leads of the ASIC as well as on the ASIC itself.

With this in mind, as discussed herein, performance of a mixed signal circuit is improved by the use of one or more shield structures. In one embodiment, the geometry of the shields is configured to correspond to the geometry of the analog and digital regions of an integrated circuit (e.g., an ASIC). In one such embodiment where two shields are employed, one shield covers the analog portion of the circuit and is connected to an analog ground and another shield covers the digital portion of the circuit and is connected to a digital ground. In one implementation, the shields are formed in a layer which is directly over the active layers of the ASIC. In another implementation, the shields are instead formed as a facing layer of a package structure such that, when the circuit is packaged, the shield is directly over the active layers of the ASIC.

Such shielding may be useful in various contexts where mixed signal circuitry, such as ADC or DAC circuitry, is employed. By way of example, such circuitry may be employed in various imaging contexts where signals are initially acquired from a detector (e.g., sensor signals) in an analog form, but are converted to a digital form for image processing and reconstruction operations. For example, X-ray based imaging approaches (e.g., fluoroscopy, mammography, angiography, computed tomography (CT), tomosynthesis, and so forth), positron emission tomography (PET), single photon emission computed tomography (SPECT), magnetic resonance imaging (MRI), ultrasound, and so forth may all use such mixed signal circuitry and could each potentially benefit from the approaches disclosed herein.

Figure 1:
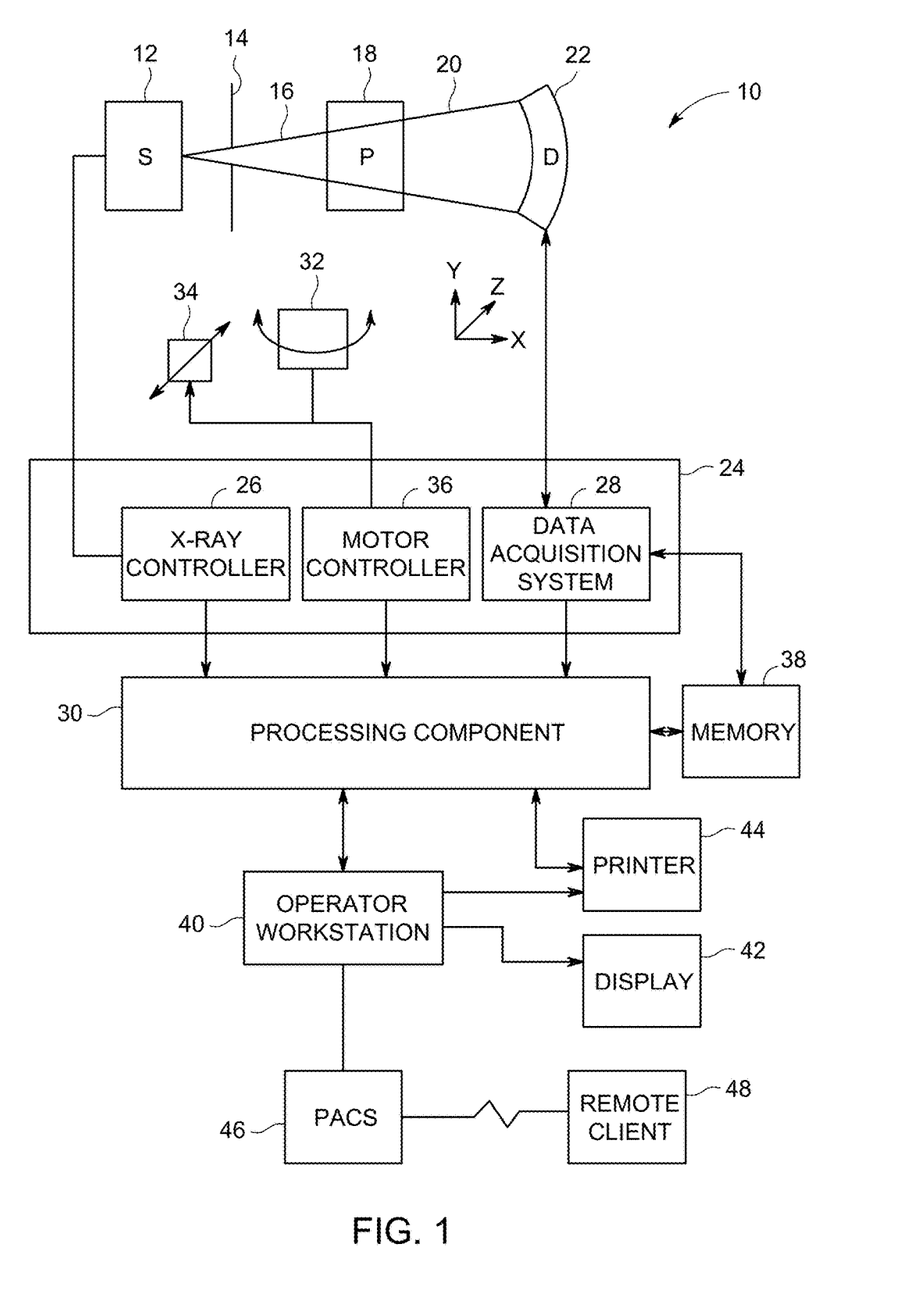
FIG. 1 is a diagrammatical view of a CT imaging system for use in producing images, in accordance with aspects of the present disclosure.

With this in mind, an example of a computer tomography (CT) imaging system 10 designed to acquire X-ray attenuation data at a variety of views around a patient (or other subject or object of interest) and suitable for image reconstruction is provided in FIG. 1. In the embodiment illustrated in FIG. 1, imaging system 10 includes a source of X-ray radiation 12 positioned adjacent to a collimator 14. The X-ray source 12 may be an X-ray tube, a distributed X-ray source (such as a solid-state or thermionic X-ray source) or any other source of X-ray radiation suitable for the acquisition of medical or other images.

The collimator 14 permits X-rays 16 to pass into a region in which a patient 18, is positioned. In the depicted example, the X-rays 16 are collimated to be a cone-shaped beam, i.e., a cone-beam, that passes through the imaged volume. A portion of the X-ray radiation 20 passes through or around the patient 18 (or other subject of interest) and impacts a detector array, represented generally at reference numeral 22. Detector elements of the array produce electrical signals that represent the intensity of the incident X-rays 20. These signals are acquired and processed to reconstruct images of the features within the patient 18.

Source 12 is controlled by a system controller 24, which furnishes both power, and control signals for CT examination sequences, including acquisition of 2D localizer or scout images used to identify anatomy of interest within the patient for subsequent scan protocols. In the depicted embodiment, the system controller 24 controls the source 12 via an X-ray controller 26 which may be a component of the system controller 24. In such an embodiment, the X-ray controller 26 may be configured to provide power and timing signals to the X-ray source 12.

Moreover, the detector 22 is coupled to the system controller 24, which controls acquisition of the signals generated in the detector 22. In the depicted embodiment, the system controller 24 acquires the signals generated by the detector using a data acquisition system 28. The data acquisition system 28 receives data collected by readout electronics of the detector 22. The data acquisition system 28 may receive sampled analog signals from the detector 22 and convert the data to digital signals for subsequent processing by a processor 30 discussed below. Alternatively, in other embodiments the digital-to-analog conversion may be performed by circuitry provided on the detector 22 itself. The system controller 24 may also execute various signal processing and filtration functions with regard to the acquired image signals, such as for initial adjustment of dynamic ranges, interleaving of digital image data, and so forth.

In the embodiment illustrated in FIG. 1, system controller 24 is coupled to a rotational subsystem 32 and a linear positioning subsystem 34. The rotational subsystem 32 enables the X-ray source 12, collimator 14 and the detector 22 to be rotated one or multiple turns around the patient 18, such as rotated primarily in an x,y-plane about the patient. It should be noted that the rotational subsystem 32 might include a gantry upon which the respective X-ray emission and detection components are disposed. Thus, in such an embodiment, the system controller 24 may be utilized to operate the gantry.

The linear positioning subsystem 34 may enable the patient 18, or more specifically a table supporting the patient, to be displaced within the bore of the CT system 10, such as in the z-direction relative to rotation of the gantry. Thus, the table may be linearly moved (in a continuous or step-wise fashion) within the gantry to generate images of particular areas of the patient 18. In the depicted embodiment, the system controller 24 controls the movement of the rotational subsystem 32 and/or the linear positioning subsystem 34 via a motor controller 36.

In general, system controller 24 commands operation of the imaging system 10 (such as via the operation of the source 12, detector 22, and positioning systems described above) to execute examination protocols, including localizer or scout scan protocols, and to process acquired data. For example, the system controller 24, via the systems and controllers noted above, may rotate a gantry supporting the source 12 and detector 22 about a subject of interest so that X-ray attenuation data may be obtained at one or more views relative to the subject. In the present context, system controller 24 may also includes signal processing circuitry, associated memory circuitry for storing programs and routines executed by the computer (such as routines for executing image processing techniques described herein), as well as configuration parameters, image data, and so forth.

In the depicted embodiment, the image signals acquired and processed by the system controller 24 are provided to a processing component 30 for reconstruction of images. The processing component 30 may be one or more conventional microprocessors. The data collected by the data acquisition system 28 may be transmitted to the processing component 30 directly or after storage in a memory 38. Any type of memory suitable for storing data might be utilized by such an exemplary system 10. For example, the memory 38 may include one or more optical, magnetic, and/or solid state memory storage structures. Moreover, the memory 38 may be located at the acquisition system site and/or may include remote storage devices for storing data, processing parameters, and/or routines for image reconstruction.

The processing component 30 may be configured to receive commands and scanning parameters from an operator via an operator workstation 40, typically equipped with a keyboard and/or other input devices. An operator may control the system 10 via the operator workstation 40. Thus, the operator may observe the reconstructed images and/or otherwise operate the system 10 using the operator workstation 40. For example, a display 42 coupled to the operator workstation 40 may be utilized to observe the reconstructed images and to control imaging. Additionally, the images may also be printed by a printer 44 which may be coupled to the operator workstation 40.

Further, the processing component 30 and operator workstation 40 may be coupled to other output devices, which may include standard or special purpose computer monitors and associated processing circuitry. One or more operator workstations 40 may be further linked in the system for outputting system parameters, requesting examinations, viewing images, and so forth. In general, displays, printers, workstations, and similar devices supplied within the system may be local to the data acquisition components, or may be remote from these components, such as elsewhere within an institution or hospital, or in an entirely different location, linked to the image acquisition system via one or more configurable networks, such as the Internet, virtual private networks, and so forth.

It should be further noted that the operator workstation 40 may also be coupled to a picture archiving and communications system (PACS) 46. PACS 46 may in turn be coupled to a remote client 48, radiology department information system (RIS), hospital information system (HIS) or to an internal or external network, so that others at different locations may gain access to the raw or processed image data.

While the preceding discussion has treated the various exemplary components of the imaging system 10 separately, these various components may be provided within a common platform or in interconnected platforms. For example, the processing component 30, memory 38, and operator workstation 40 may be provided collectively as a general or special purpose computer or workstation configured to operate in accordance with the aspects of the present disclosure. In such embodiments, the general or special purpose computer may be provided as a separate component with respect to the data acquisition components of the system 10 or may be provided in a common platform with such components. Likewise, the system controller 24 may be provided as part of such a computer or workstation or as part of a separate system dedicated to image acquisition.

With the preceding system discussion in mind, the system of FIG. 1 may include one or more integrated circuits configured to handle mixed signals (i.e., analog and digital signals) within a single circuit substrate (e.g., on the same ASIC). For example, in the context of an imaging system, such as the system shown in FIG. 1, data read out from the detector 22 may be in analog form initially and converted to digital form for reconstruction or processing by the processing component 30. The conversion of the acquired signals from analog to digital form may occur on an integrated circuit configured to perform such a conversion operation on a single chip, such as an analog-to-digital conversion ASIC. As noted above, one issue that may arise on such a mixed signal chip is that propagation of one type of signal to channels associated with the other type may negatively impact performance of the chip, such as in the case where digital signals radiate into the analog input channels of a conversion circuit.

With this in mind, the present approaches employ shields to prevent such signal propagation. The geometry of the shields is configured to correspond to the geometry of the respective analog or digital regions of the integrated circuit. For example, in a two shield implementation, one shield may be positioned over the portion of the circuit where analog signal processing occurs and may be connected to an analog ground. Similarly, another shield may be positioned over the portion of the circuit where digital signal processing occurs and may be connected to a digital ground. The shields may be formed in a layer which is directly over the respective active layers of the integrated circuit or ASIC, either as a layer of the chip itself or as a facing layer of a packaging structure.

For example, in one embodiment, the shield layer may be integrated into the substrate of a chip package, such as a flip-chip, chip-scale package or a two-sided package. In such a package implementation, the shield layer may be provided as a facing surface of the portion of the package that interfaces with the ASIC circuit layer such that, upon assembly of the package, the shield layer is positioned over the respective digital or analog portion of the ASIC. In an alternate embodiment, the shield layer is formed as the top metal layer of the integrated circuit itself. That is, in such an embodiment, the shield layer may instead be applied to or formed on the circuit (e.g., the ASIC) over the respective active surface corresponding to the digital or analog portion of the integrated circuit, regardless of whether the integrated circuit is subsequently packaged as part of a package assembly.

Figure 2:
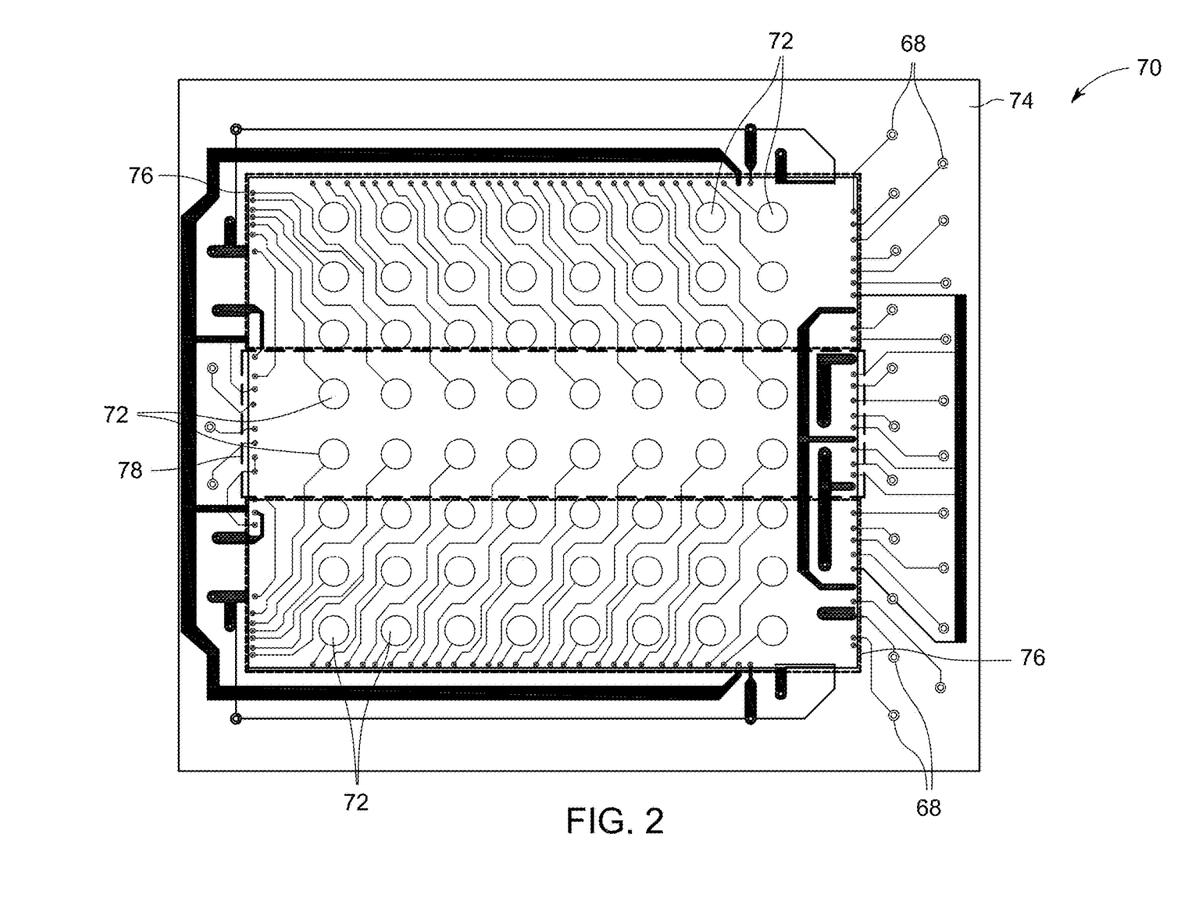
FIG. 2 depicts a plan view of a mixed signal circuit, in accordance with aspects of the present disclosure.

With the preceding in mind, and turning to FIG. 2, an example of a mixed signal ASIC 70 is depicted having conductive traces and contact pads 72 formed on a suitable substrate 74. The depicted example is of a two-sided chip, with analog inputs in the form of contact pads 72 on one surface of and toward the center of the chip and with the digital outputs positioned along an edge on the opposite surface of the chip. In the depicted example, the location of the digital output contacts is shown by the location of through structure or vias 68 that may be seen on the side of the chip on which the analog contact pads 72 are disposed. The contact pads 72 associated with receiving analog inputs may receive analog signals (such as signals read out from a detector 22) that are routed to conversion portions of the circuit 70. The contact pads associated with digital output on the opposing surface of the chip may output digital signals from the conversion portions of the circuit 70 to downstream processing components (e.g., processing component 30) or storage components.

In a mixed signal chip, processing of the signals, such as conversion of analog signals to digital signals and subsequent routing or processing of the digital signals, may be localized to actual physical locations of the chip or to specific electrical structures of the circuit 70. That is, identifiable portions of the chip or circuit (e.g., ASIC 70) may correspond to analog operations or processing, while other portions may correspond to digital operations or processing. By way of example, in FIG. 2, a first box is depicted about a portion 78 of the circuit 70 that corresponds to digital operations or processing by the circuit, and thus may be considered the digital portion 78 of the circuit 70. Conversely, second and third boxes delineate regions or portions 76 of the circuit 70 that correspond to the analog portion 76 of the circuit 70. As may be seen in the example of FIG. 2, a number of contact pads 72 otherwise associated with receiving analog inputs actually overlay the digital portion 78 of the circuit 70. That is, digital signal routing and processing physically occur within the chip beneath these pads 72 which overlay the digital portion 78 of the chip. Such overlap may allow propagation of the digital signals into the analog signal channels associated with the overlying contact pads, leading to degradation of the analog signals routed through these overlying contact pads.

Figure 3:
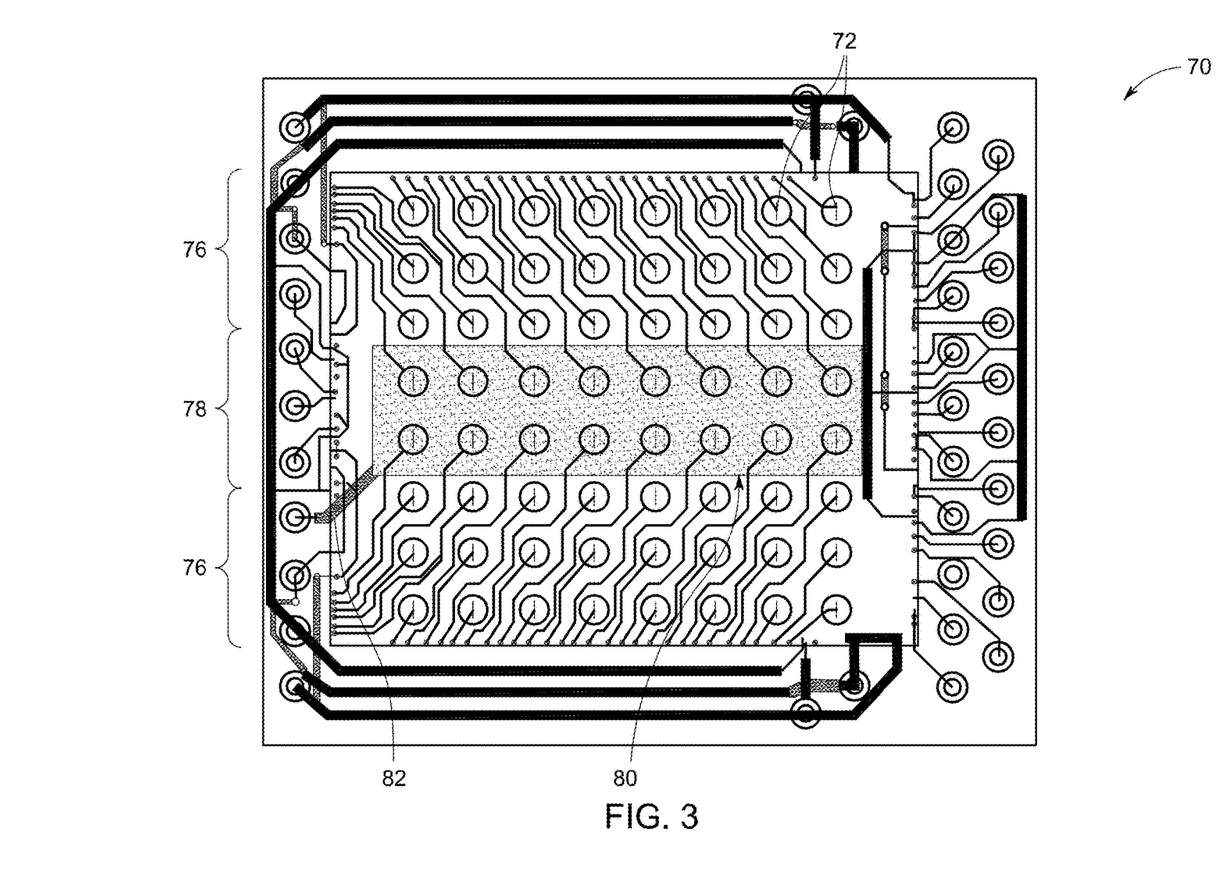
FIG. 3 depicts a plan view of a mixed signal circuit having a patterned grounded digital shield, in accordance with aspects of the present disclosure.

Turning to FIG. 3, one implementation of the present approach is depicted in which a shield 80 is positioned over the digital portion 78 of the circuit 70 to prevent propagation of digital signals into overlapping contact pads or conductive paths associated with analog signals. In one embodiment, the shield 80 is patterned, as depicted in FIG. 3. The composition of the shield 80 may include any suitable conductive shielding material, such as copper, aluminum, tungsten, and so forth. In one embodiment, the underlying circuit 70 may be formed conventionally, for example as copper (or other conductive material) formed into contacts and traces within or on a silicon (or other suitable) substrate using conventional integrated circuit manufacturing techniques. In one implementation, a polyimide dielectric (or other suitable dielectric) may be applied over all or a portion of the integrated circuit (such as a thin film polyimide application) and the shield 80 applied or positioned over the polyimide layer over the region to be shielded, such as the depicted digital portion 78 of the circuit 70. In addition, in the depicted example, the shield 80 is also tied to the digital ground (as depicted by conductive trace 82) such that the shield 80 is a digitally-grounded shield.

Figure 4:
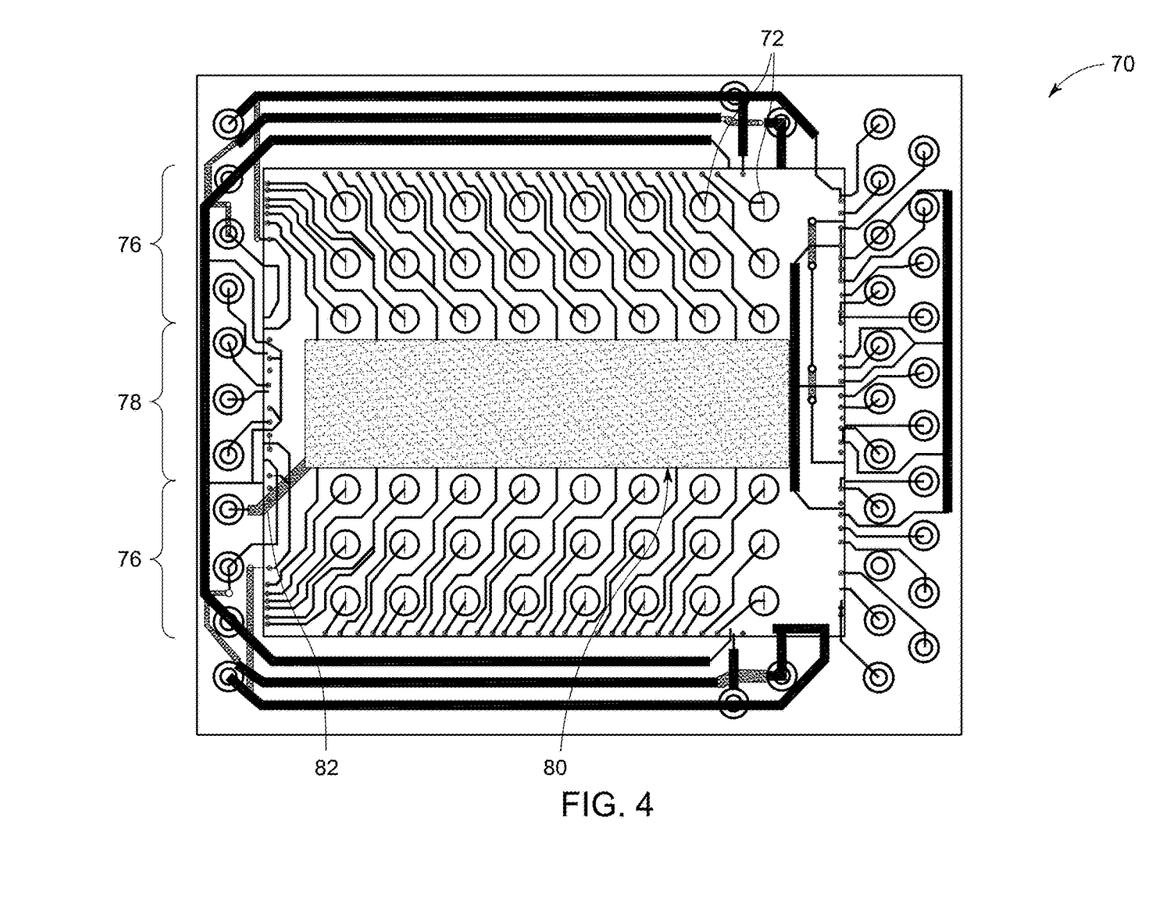
FIG. 4 depicts a plan view of a mixed signal circuit having a solid grounded digital shield, in accordance with aspects of the present disclosure.

Similarly, in FIG. 4, a shield 80 is depicted positioned over the digital portion of the integrated circuit 70. However, in the depicted example, the shield 80 is not patterned, but is instead formed without patterning or openings, i.e., a solid shield. As in the previous example, the solid shield may be formed from any suitable material, including copper, aluminum, tungsten, and so forth. The shield 80 may be formed integrally with the circuit, such as during the wafer manufacture process.

Figure 5:
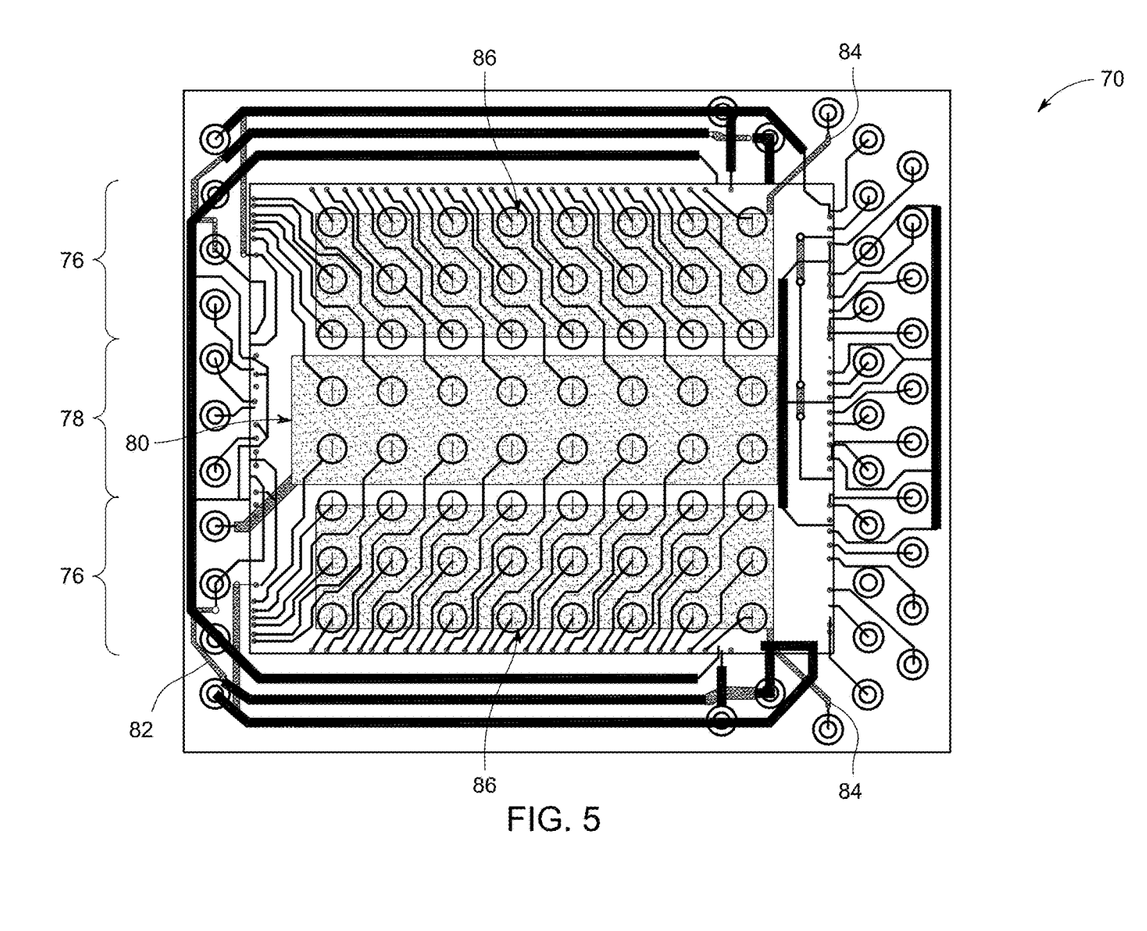
FIG. 5 depicts a plan view of a mixed signal circuit having a grounded digital shield and a grounded analog shield, in accordance with aspects of the present disclosure.

Turning to FIG. 5, in a further embodiment additional shields 86 may be provided over the analog portions 76 of the circuit 70 (i.e., those portions of the circuit 70 associated with analog signal processing and routing). In the depicted example, the additional shields 86 are depicted as patterned, though in other embodiments they may instead be solid. As in the preceding examples, the additional shields 86 may be constructed from copper, aluminum, tungsten, or any other suitable shielding material. As with the digitally-grounded shield 80, the additional shields 86 may be conductively connected to the analog ground of the circuit 70 (as shown by conductive trace 84) such that the shields 86 are analog grounded.

Figure 6:
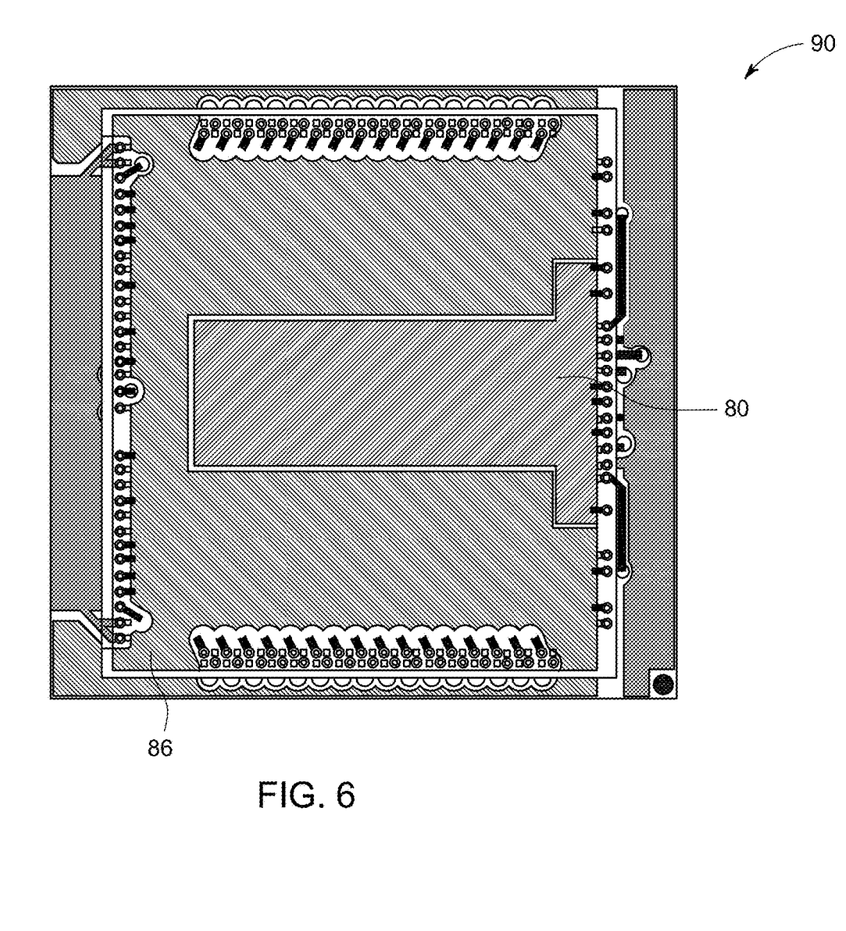
FIG. 6 depicts a plan view of a package component having digital and analog signal shielding, in accordance with aspects of the present disclosure.
Figure 7:
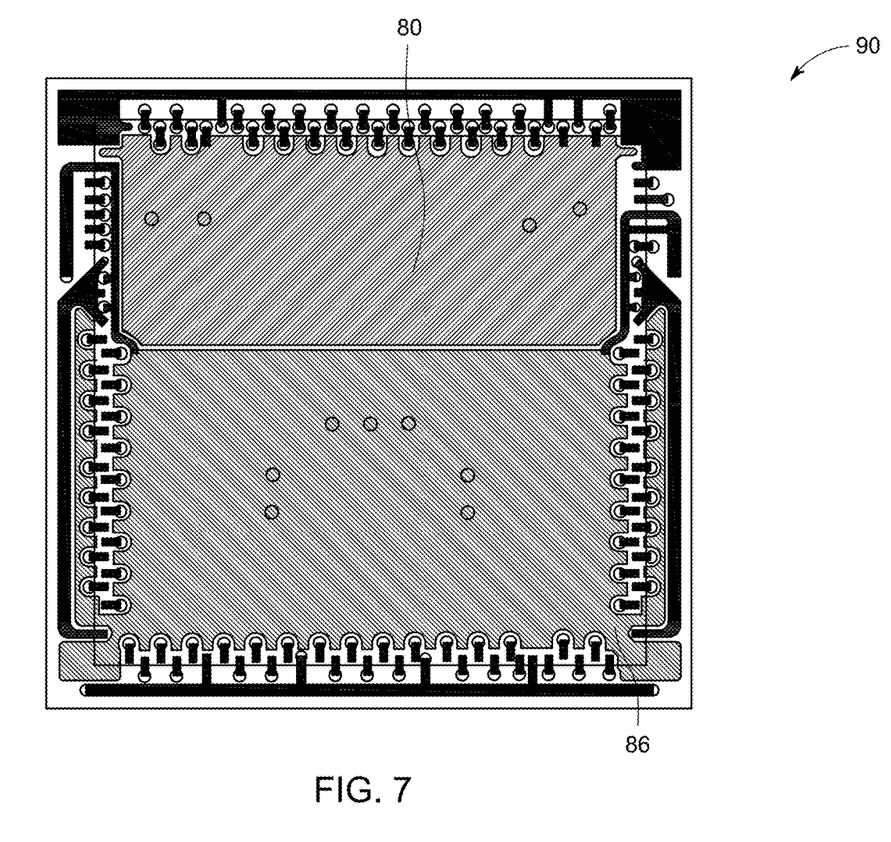
FIG. 7 depicts an additional plan view of a package component having digital and analog signal shielding, in accordance with aspects of the present disclosure.

With the preceding in mind, FIGS. 6 and 7 depict further examples of a shield 80 being provided as part of a package component or structure 90 that, when integrated with a mixed signal chip or integrated circuit to form a package assembly, covers and shields a digital portion of a mixed signal chip or circuit. FIG. 6 depicts a chip scale package configured for a specific mixed signal ASIC while FIG. 7 depicts an alternative arrangement configured for a different ASIC. In particular, FIGS. 6 and 7 each respectively depict package structures 90 configured to interface with a mixed signal chip or integrated circuit so as to form a package assembly. In these examples, the package structure 90 includes a shield 80 that is shaped, sized, and positioned so as to correspond to that portion of the chip or circuit dedicated to digital signal processing when the package assembly is formed. Similarly, in both examples, an additional shield 86 is depicted that corresponds to and covers that portion of the chip or circuit dedicated to analog signal processing when the package assembly is formed. In this manner, crosstalk between the analog and digital processing portions of the circuit may be reduced or eliminated due to the shielding provided by the package structure 90 and the performance of the circuit, such as an ADC or DAC circuit, may be improved.

Figure 8:
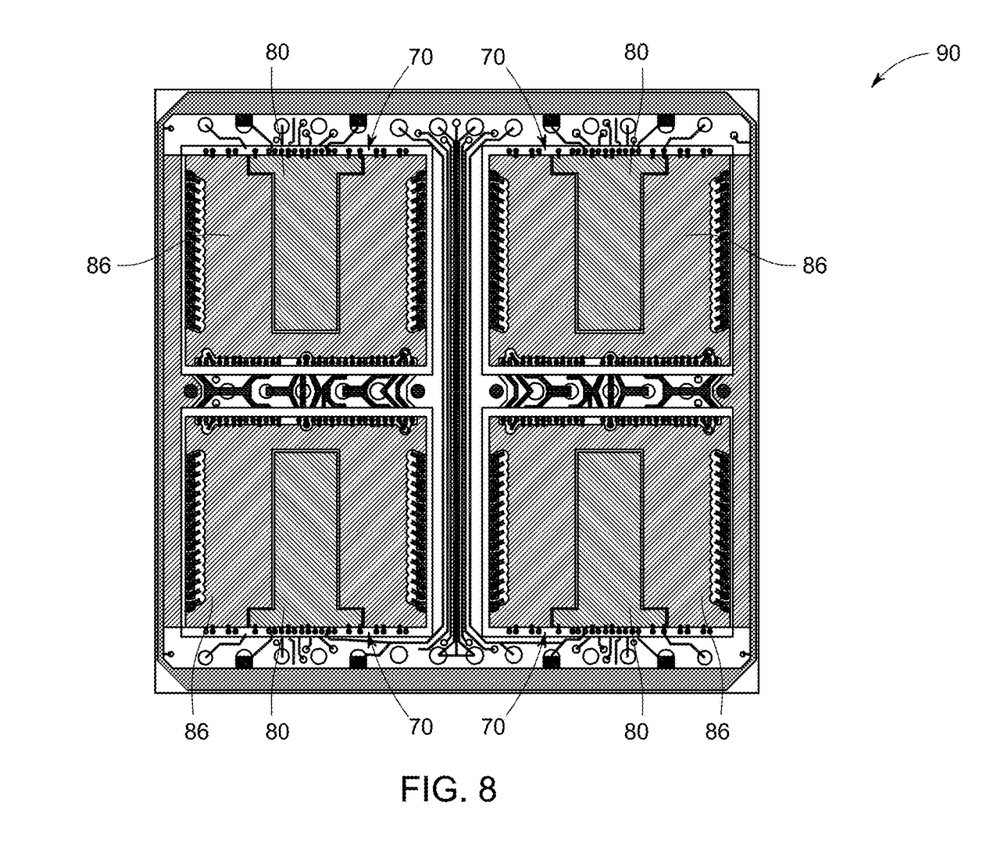
FIG. 8 depicts a further plan view of a package component having digital and analog signal shielding, in accordance with aspects of the present disclosure.

Turning to FIG. 8, in a further example, a package component or structure 90 is depicted that is suitable for forming a two-sided package containing a plurality of mixed-signal ASICs. For example, to the extent that the analog and digital circuitry may be segregated externally to the package, (as discussed in U.S. Pat. No. 8,492,762, titled "Electrical Interface for a Sensor Array", incorporated herein by reference in its entirety for all purposes), having contacts and/or conductive traces on both front and back surfaces, a two-sided package component 90 may be provided which provides a plane of shielding segregating the front and back surfaces of the mixed signal chips and circuitry. In this example, the package structure 90 includes a shield 80 that is shaped, sized, and positioned so as to correspond to that portion of the chips and circuitry dedicated to digital signal processing, on and below the plane of the shield, when the package assembly is formed. Similarly, an additional shield 86 is depicted that corresponds to and covers that portion of the chips and circuitry dedicated to analog signal processing, on and above the plane of the shield, when the package assembly is formed. As in the preceding examples, the respective shields 80 and 86 may be formed from any suitable material (e.g., copper, aluminum, tungsten, and so forth) and may be formed as a layer or patterned layer of material.

As discussed above, the shields 80 and 86 may be interfaced with the respective portions of the mixed signal circuit in various ways. For example, where the circuit 70 has been previously diced and will be incorporated into an integrated circuit package, the respective shields 80 and/or 86 may be formed as the facing layer of the package such that, when the package is assembled, the shields 80 and/or 86 are positioned appropriately over the digital and/or analog portions of the circuit 70. Alternatively, as noted above, the shields 80 and/or 86 may instead be formed on the wafer on which multiple circuits 70 are formed. In such an embodiment, instead of the shield being the facing layer of the package that interfaces with the circuit 70, the shields are instead the "top" layer of the chip or circuit 70 that interfaces with the package when forming the package assembly. It should be noted that in the embodiment where shields 80 and/or 86 are formed on the facing layer of the package, the shields may be extended beyond the boundaries of chips or circuits 70 as necessary.

Technical effects of the invention include construction and use of a shielded mixed-signal circuit. The shields may cover one or both of a digital portion and an analog portion of the mixed-signal circuit so as to reduce or eliminate propagation of one signal types to portions of the circuit handling the other signal type. Performance of the mixed signal circuit is improved by inclusion of the shielding.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A mixed signal integrated circuit assembly, comprising:
a substrate comprising a plurality of conductive traces and contact pads, wherein the substrate comprises:
a digital portion configured to route and process digital signals; and
an analog portion configured to route and process analog signals; and
a packaging structure, comprising:
a first shield formed on a facing surface of the packaging structure disposed about at least a portion of the substrate, the first shield positioned over the digital portion of the substrate so as to limit propagation of signals between the digital portion and the analog portion; and
a second shield formed on the facing surface of the packaging structure disposed about at least a second portion of the substrate, the second shield position over the analog portion of the substrate,
wherein the packaging structure is configured to geometrically align the first shield with the digital portion of the substrate and the second shield with the analog portion of the substrate.

2. The mixed signal integrated circuit assembly of claim 1, wherein the first shield is conductively connected to a digital ground.

3. The mixed signal integrated circuit assembly of claim 1, wherein the first shield is patterned.

4. The mixed signal integrated circuit assembly of claim 1, wherein the first shield is solid.

5. The mixed signal integrated circuit assembly of claim 1, wherein the second shield is conductively connected to an analog ground.

6. The mixed signal integrated circuit assembly of claim 1, wherein the second shield is patterned.

7. The mixed signal integrated circuit assembly of claim 1, wherein the second shield is solid.

8. A semiconductor package assembly, comprising:
a mixed signal integrated circuit comprising:
a digital portion configured to route and process digital signals; and
an analog portion configured to route and process analog signals;
a package structure configured to interface with the mixed signal integrated circuit to form the semiconductor package assembly, the package structure comprising:
a first shield and a second shield formed as a facing surface of the packaging structure, wherein the first shield, when interfaced with the mixed signal integrated circuit, is configured to correspond to the shape, size, and position of the digital portion of the mixed signal integrated circuit and the second shield, when interfaced with the conversion circuit, is configured to correspond to the shape, size, and position of the analog portion of the mixed signal integrated circuit when the package structure is assembled with the mixed signal integrated circuit, wherein the first shield and the second shield limits propagation of signals between the digital portion and the analog portion of the mixed signal integrated circuit, wherein the package structure and mixed signal integrated circuit are separate non-integral components with respect to one another.

9. The semiconductor package assembly of claim 8, wherein the first shield overlays the digital portion of the mixed signal integrated circuit and wherein the first shield is connected to a digital ground.

10. The semiconductor package assembly of claim 8, wherein the first shield overlays the analog portion of the mixed signal integrated circuit and wherein the first shield is connected to an analog ground.

11. The semiconductor package assembly of claim 8, wherein the first shield is patterned.

12. The semiconductor package assembly of claim 8, wherein the first shield is solid.

13. A non-invasive imaging system, comprising:
a detector assembly configured to generate analog signals in response to detected signals;
a conversion circuit configured to convert the analog signals to digital signals, the conversion circuit comprising:
an analog portion configured to route and process the analog signals;
a digital portion configured to route and process digital signals; and
a package structure configured to interface with the conversion circuit to form a semiconductor package assembly, the package structure having a first shield and a second shield formed on a facing surface of the packaging structure, wherein the first shield, when interfaced with the conversion circuit, is configured to correspond to the shape, size, and position of the digital portion and the second shield, when interfaced with the conversion circuit, is configured to correspond to the shape, size, and position of the analog portion of the conversion circuit, wherein the first shield and the second shield limit limit propagation of signals between the digital portion and the analog portion of the conversion circuit, wherein the package structure and conversion circuit are separate non-integral components with respect to one another; and
a processing component configured to receive and process the digital signal to generate one or more images and to display the one or more images.

14. The non-invasive imaging system of claim 13, wherein the first shield overlays the digital portion of the conversion circuit and wherein the first shield is connected to a digital ground.

15. The non-invasive imaging system of claim 13, wherein the first shield overlays the analog portion of the conversion circuit and wherein the first shield is connected to an analog ground.

16. The non-invasive imaging system of claim 13, wherein the first shield is patterned.

17. The non-invasive imaging system of claim 13, wherein the first shield is solid.

* * * * *